US010430113B2

(12) United States Patent
Ikarashi

(10) Patent No.: US 10,430,113 B2
(45) Date of Patent: Oct. 1, 2019

(54) MEMORY CONTROL CIRCUIT AND MEMORY CONTROL METHOD

(71) Applicant: SONY CORPORATION, Tokyo (JP)

(72) Inventor: Takahiro Ikarashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/570,905

(22) PCT Filed: Apr. 26, 2016

(86) PCT No.: PCT/JP2016/062997
§ 371 (c)(1),
(2) Date: Oct. 31, 2017

(87) PCT Pub. No.: WO2016/185879
PCT Pub. Date: Nov. 24, 2016

(65) Prior Publication Data
US 2018/0357009 A1    Dec. 13, 2018

(30) Foreign Application Priority Data
May 20, 2015 (JP) ................. 2015-102625

(51) Int. Cl.
*G06F 12/00* (2006.01)
*G06F 3/06* (2006.01)
(Continued)

(52) U.S. Cl.
CPC .......... *G06F 3/0655* (2013.01); *G06F 3/0604* (2013.01); *G06F 3/0673* (2013.01);
(Continued)

(58) Field of Classification Search
CPC ................. G06F 3/061; G06F 12/06
See application file for complete search history.

(56) References Cited

U.S. PATENT DOCUMENTS 6,310,814 B1 * 10/2001 Hampel ............... G11C 11/406
365/203
9,432,298 B1 * 8/2016 Smith ................ H04L 49/9057
(Continued)

FOREIGN PATENT DOCUMENTS

| CN | 1071771 A | 5/1993 |
|---|---|---|
| EP | 0540198 A1 | 5/1993 |

(Continued)

OTHER PUBLICATIONS

International Search Report and Written Opinion of PCT Application No. PCT/JP2016/062997, dated Jun. 14, 2016, 07 pages of English Translation and 07 pages Of ISRWO.

(Continued)

*Primary Examiner* — Baboucarr Faal
(74) *Attorney, Agent, or Firm* — Chip Law Group

(57) ABSTRACT

A memory control circuit according to the disclosure includes a memory control section that selectively uses a first issuing mode in which a plurality of control commands are issued without performing bank group interleaving and a second issuing mode in which the bank group interleaving is performed and the plurality of control commands are issued, and thereby issues the control commands to a plurality of bank groups in a memory having a bank group function.

7 Claims, 17 Drawing Sheets

(51) Int. Cl.
*G06F 12/06* (2006.01)
*G11C 7/10* (2006.01)
(52) U.S. Cl.
CPC ............... *G06F 12/06* (2013.01); *G11C 7/10* (2013.01); *G11C 7/1042* (2013.01)

(56) References Cited

U.S. PATENT DOCUMENTS

| | | | |
|---|---|---|---|
| 2005/0060482 A1* | 3/2005 | Ishikawa | G06F 12/0607 711/5 |
| 2008/0007438 A1 | 1/2008 | Segall et al. | |
| 2013/0003830 A1 | 1/2013 | Misra et al. | |
| 2013/0114675 A1 | 5/2013 | Guo et al. | |
| 2014/0006770 A1* | 1/2014 | Cox | G06F 12/0607 713/100 |
| 2015/0046642 A1 | 2/2015 | Lee et al. | |
| 2016/0179374 A1* | 6/2016 | Berke | G06F 12/02 711/104 |
| 2018/0342282 A1* | 11/2018 | Morgan | G11C 11/40603 |

FOREIGN PATENT DOCUMENTS

| | | |
|---|---|---|
| JP | 05-134923 A | 6/1993 |
| JP | 2004-164641 A | 6/2004 |
| JP | 2008-152687 A | 7/2008 |
| JP | 2010-277216 A | 12/2010 |

OTHER PUBLICATIONS

International Preliminary Report on Patentability of PCT Application No. PCT/JP2016/062997, dated Nov. 30 2017, 07 pages of English Translation and 04 pages of IPRP.
"JEDEC Standard DDR4 SDRAM", JEDEC Solid State Technology Association, Internet: <URL: http://www.jedec.org/sites/default/files/docs/JESD79.4A.pdf, Nov. 2013, pp. 77-78.
"JEDEC Standard DDR4 SDRAM", JEDEC Solid State Technology Association, JEDEC Standard No. 79-4, Sep. 2012, 214 pages.
"JEDEC Solid State Technology Association", DDR4 SDRAM, JESD79-4, JEDEC Standard No. 79-4, Sep. 2012, 214 pages.
Final Office Action in U.S. Appl. No. 15/921,836 dated Apr. 19, 2019.

* cited by examiner

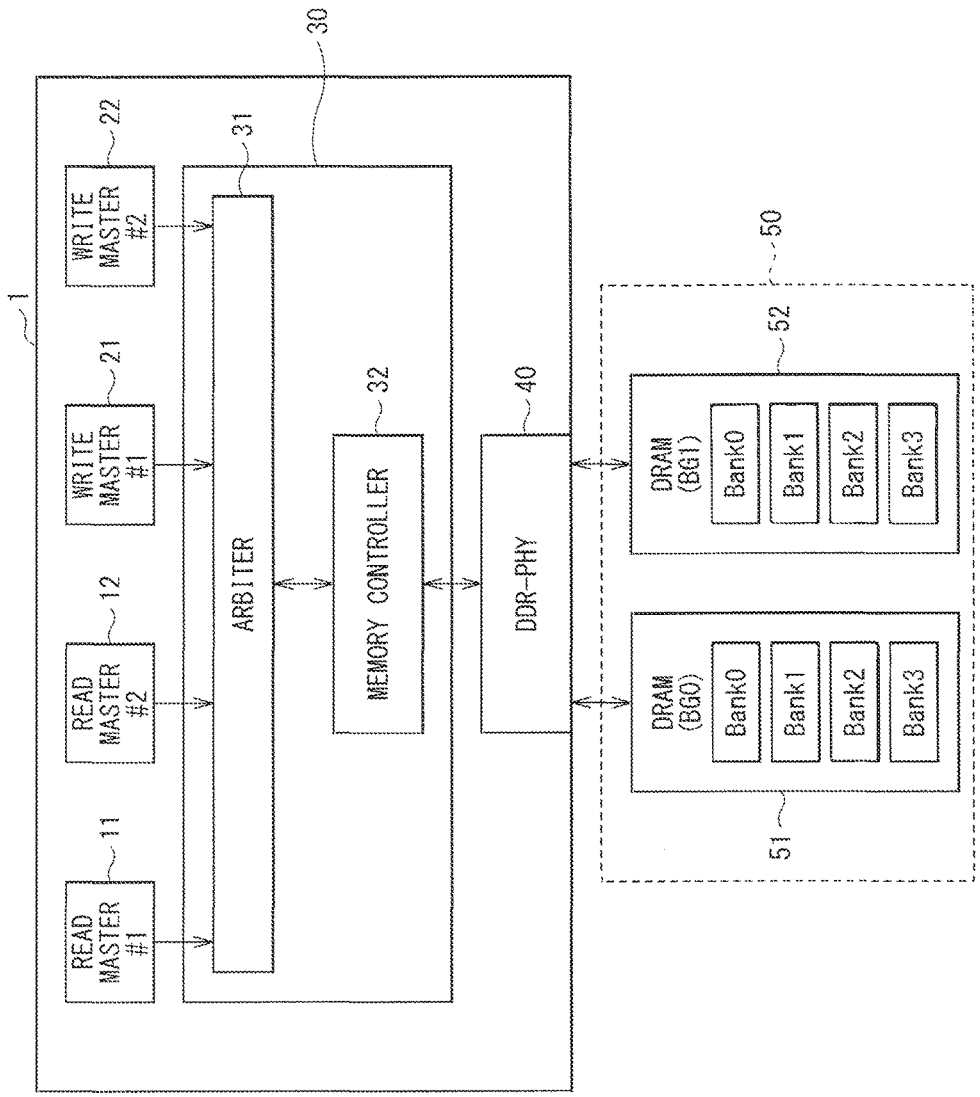
[FIG. 1]

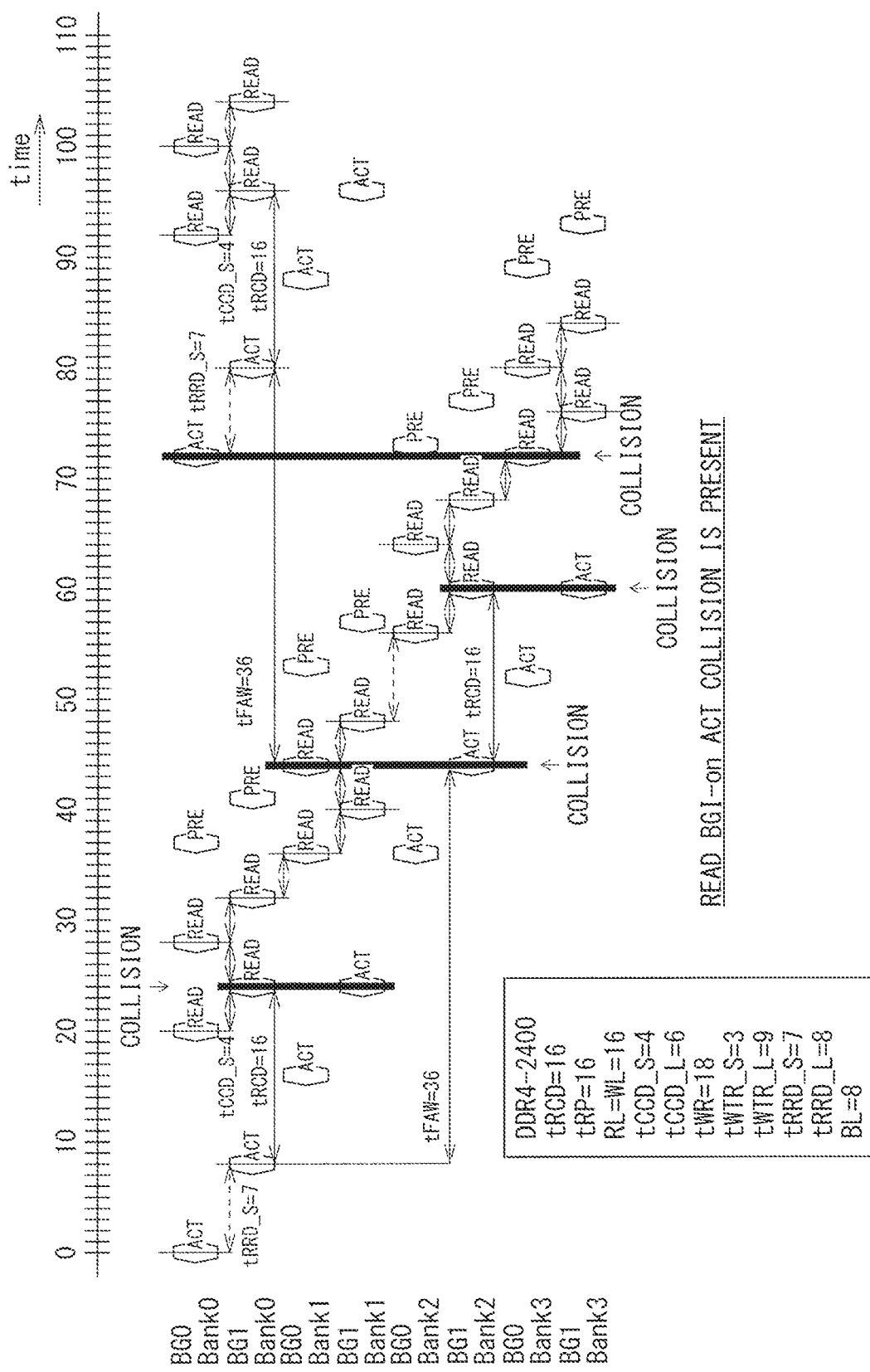

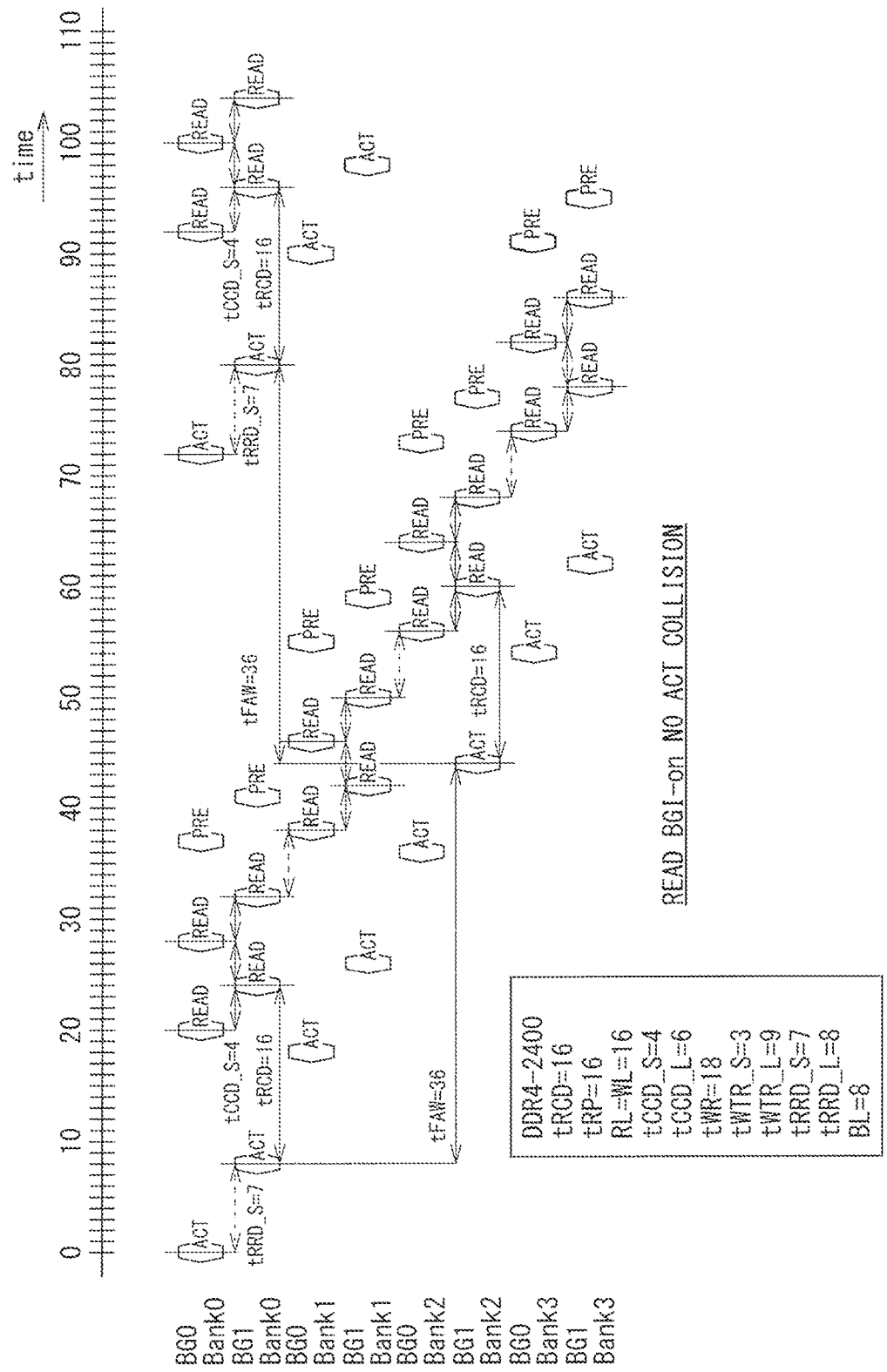
[FIG. 3]

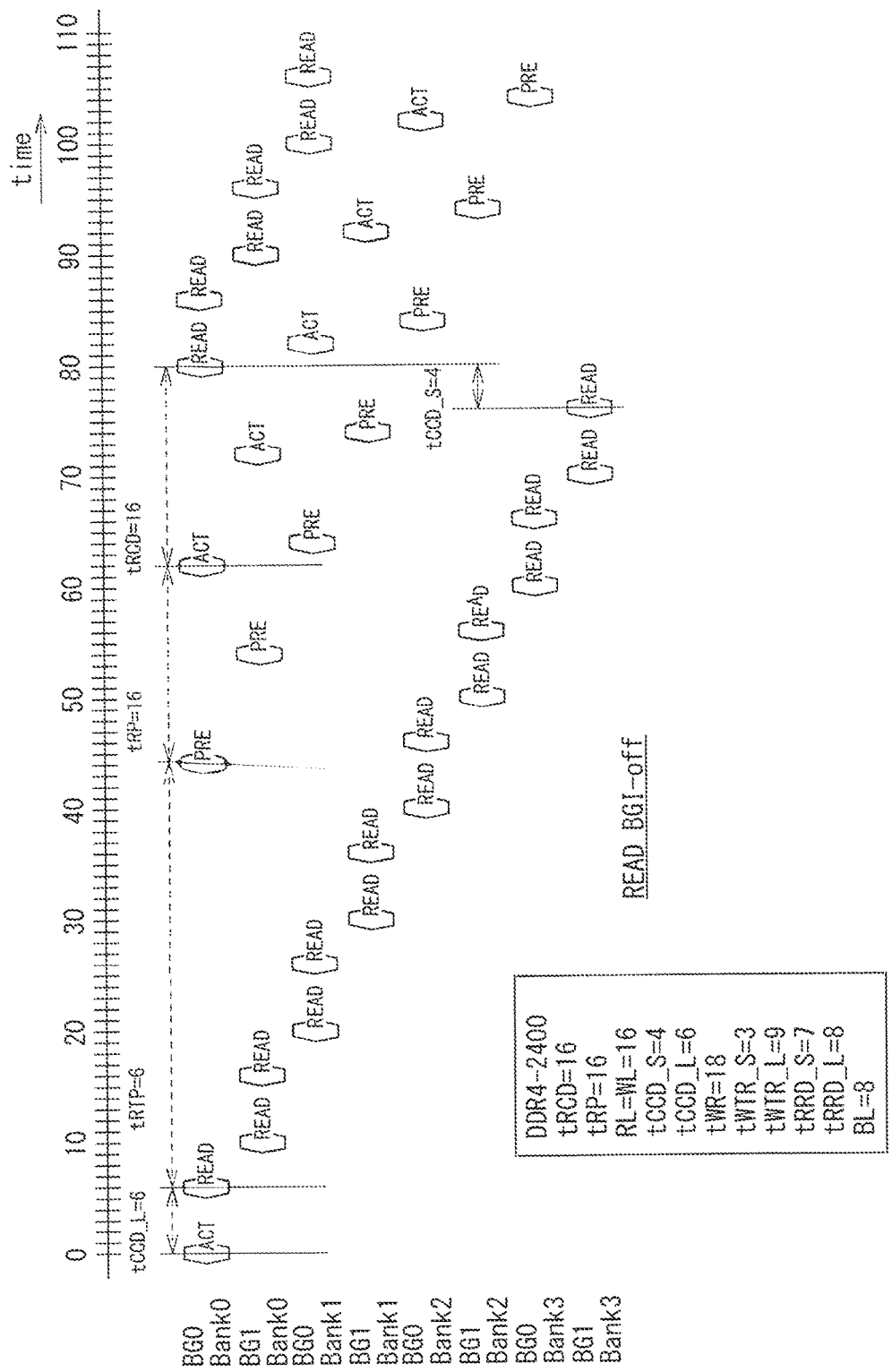
[FIG. 4]

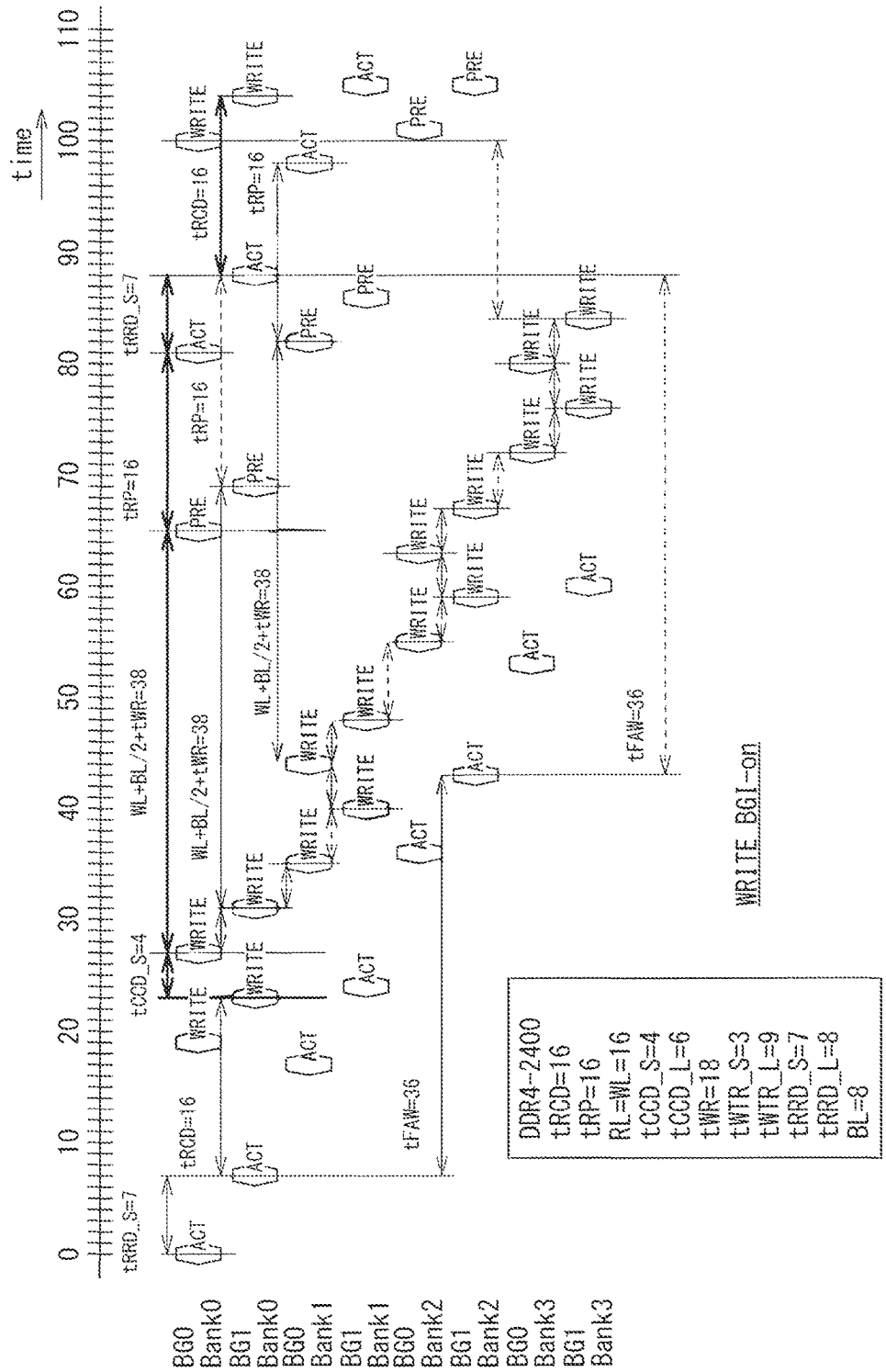

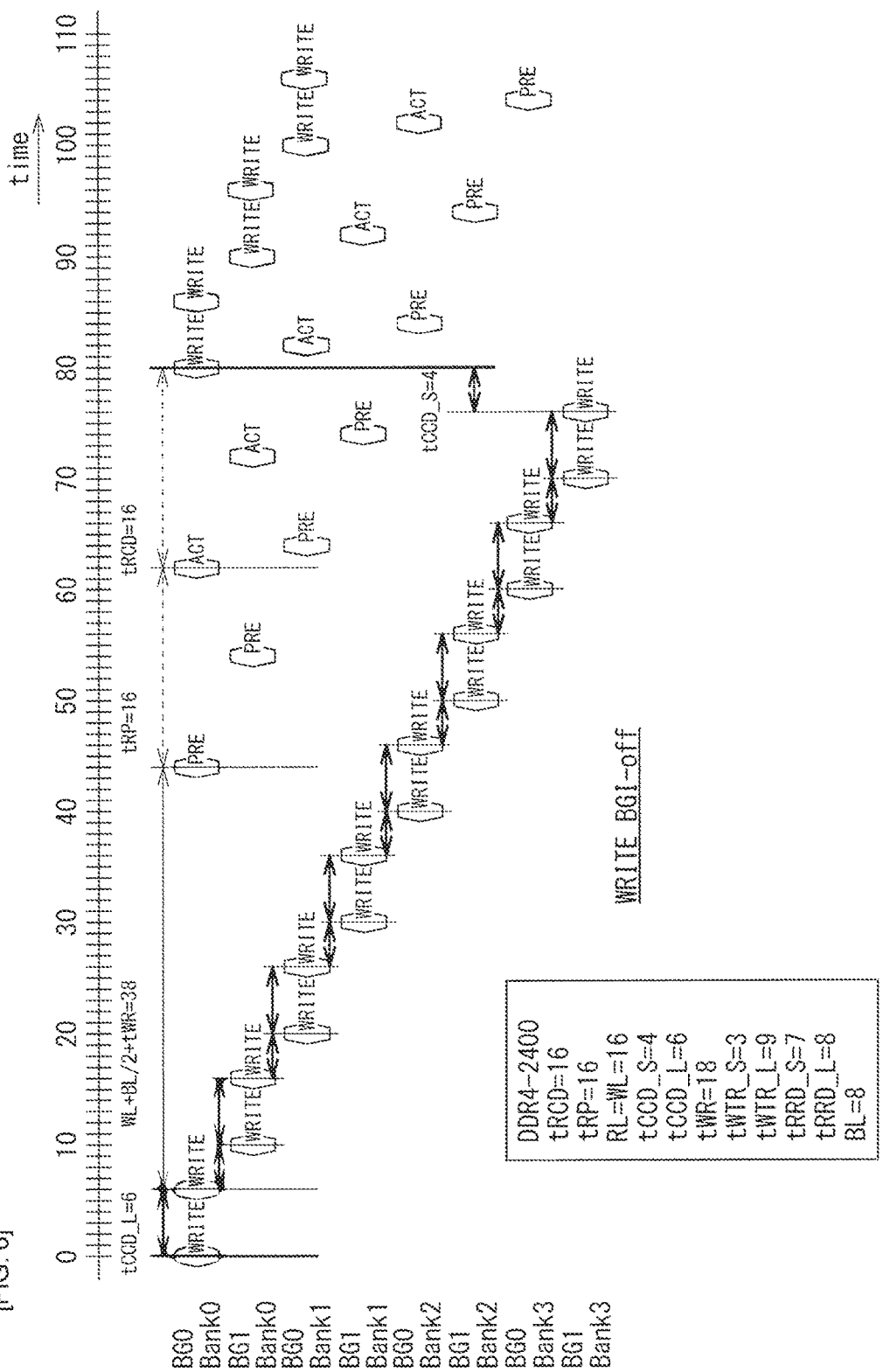
[FIG. 6]

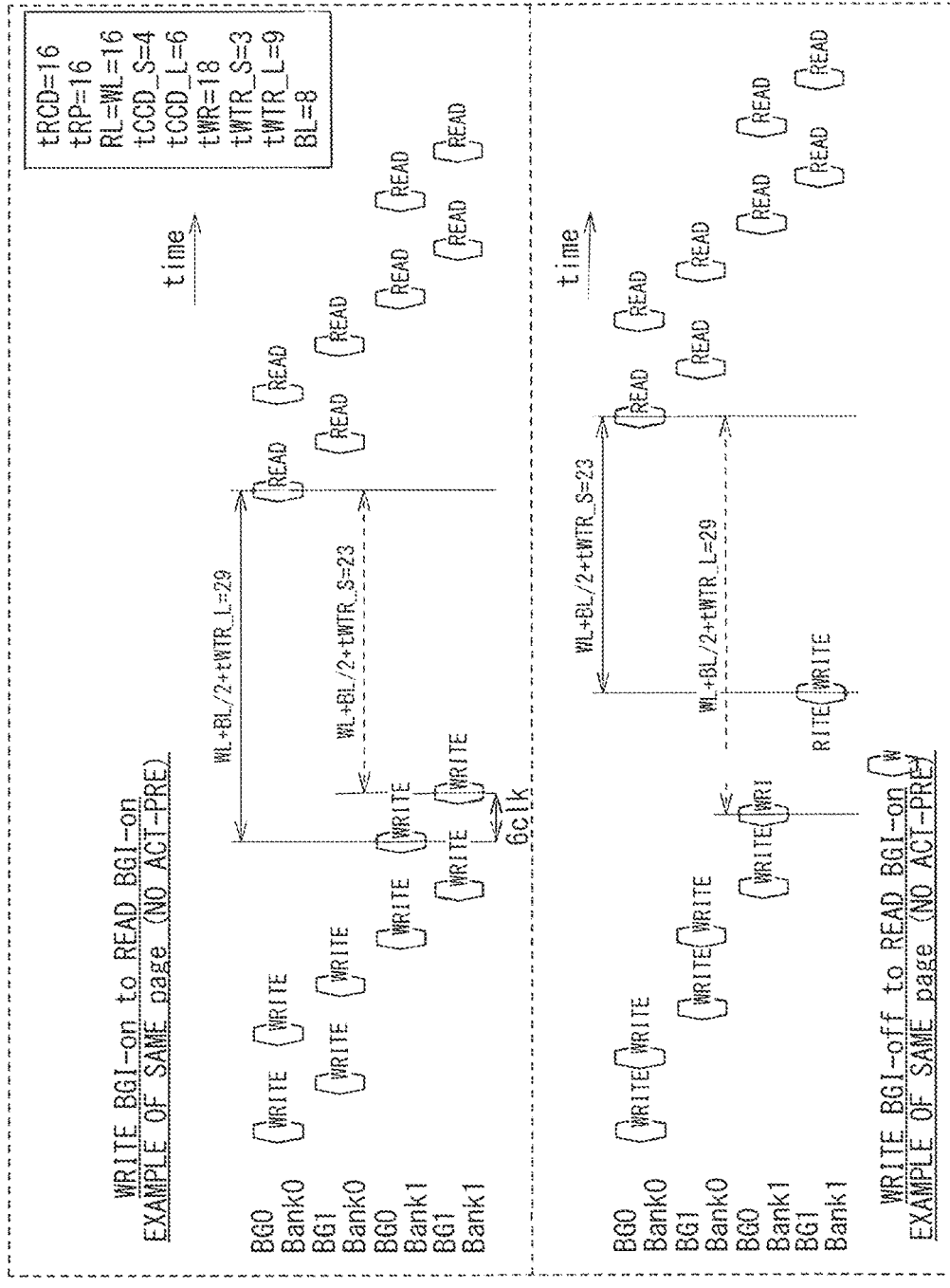
[FIG. 7]

[FIG. 8]
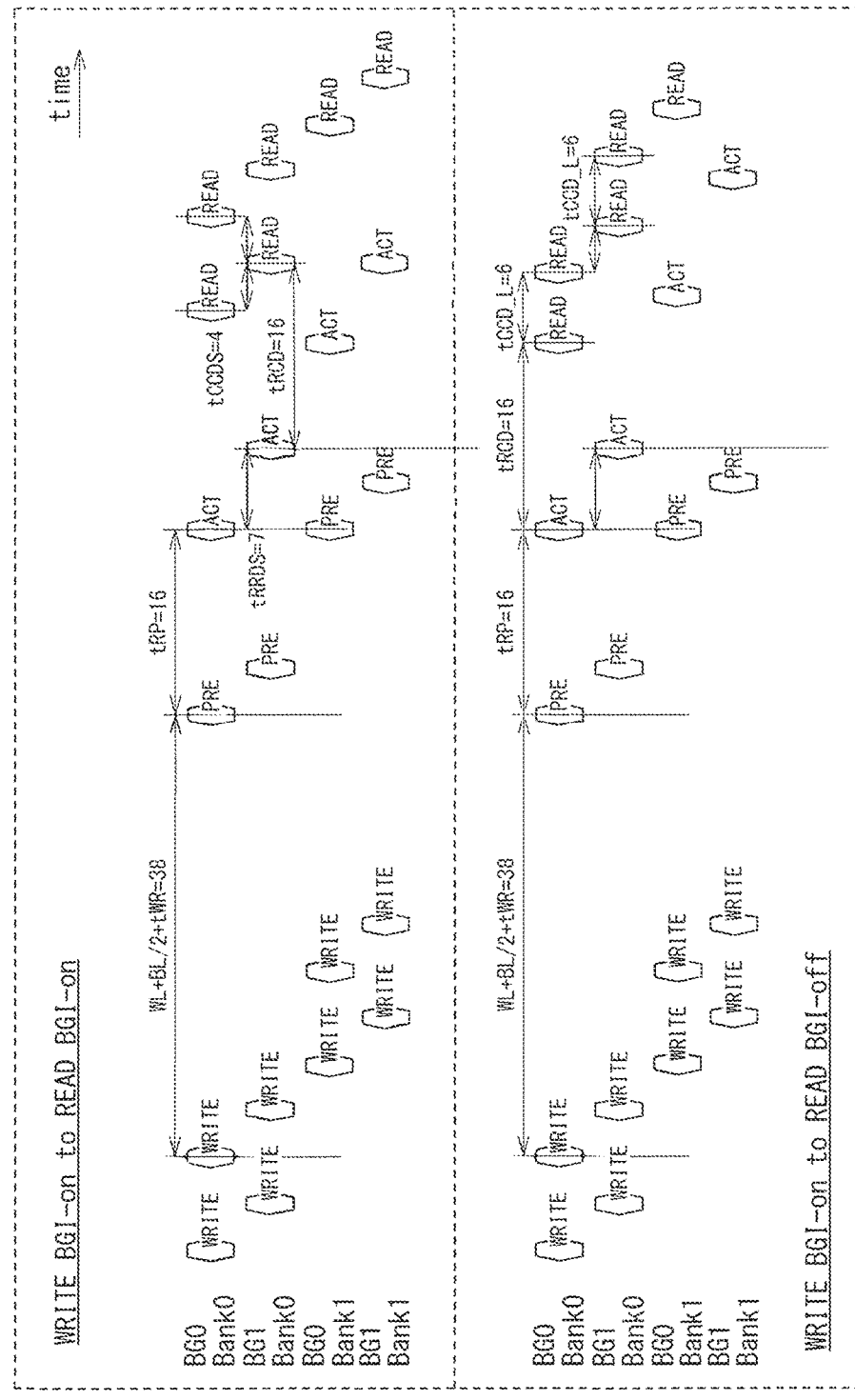

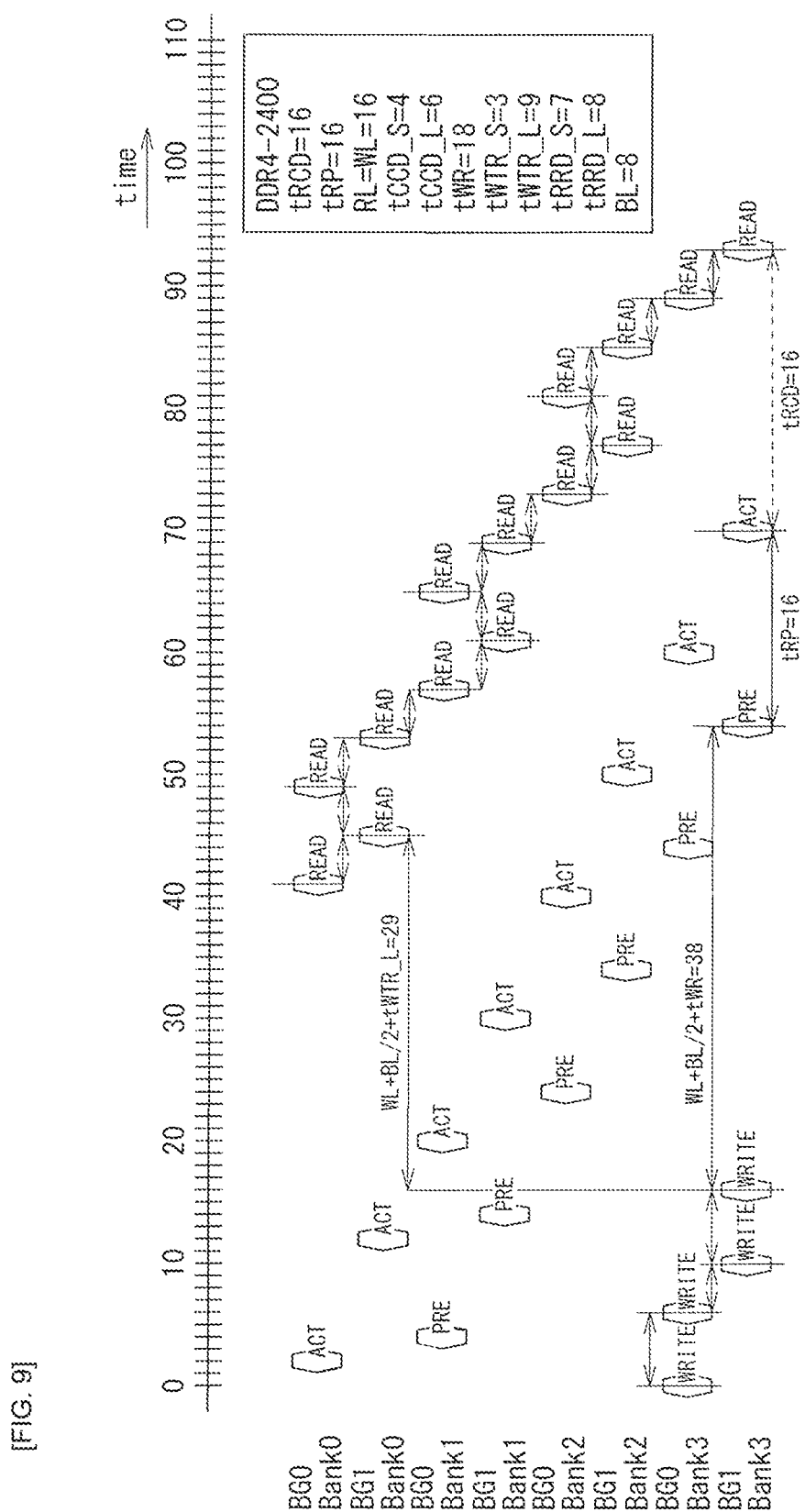

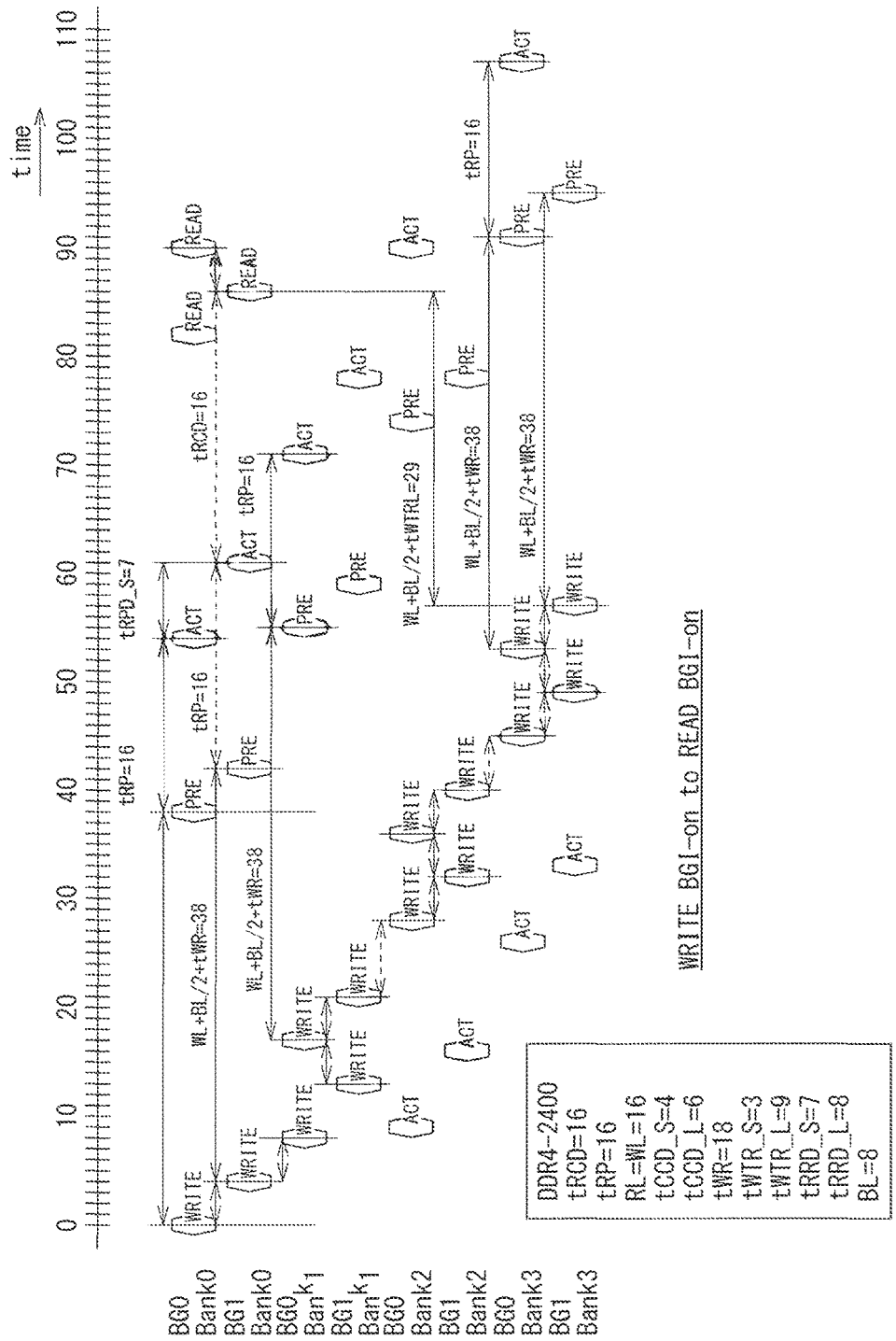
[FIG. 10]

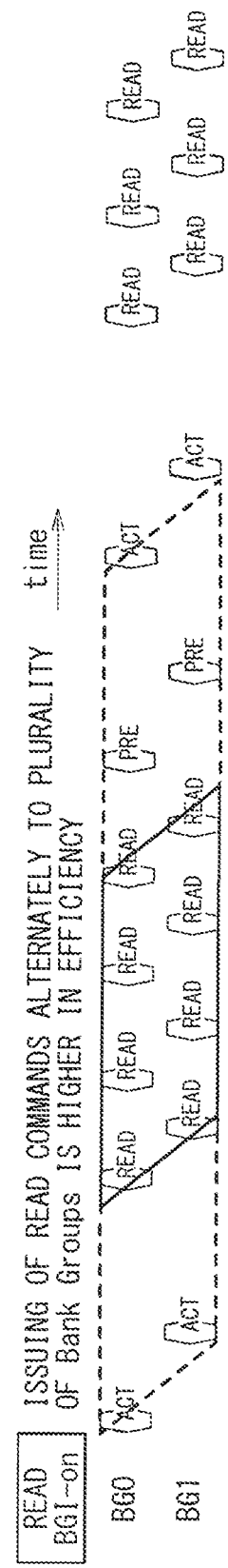

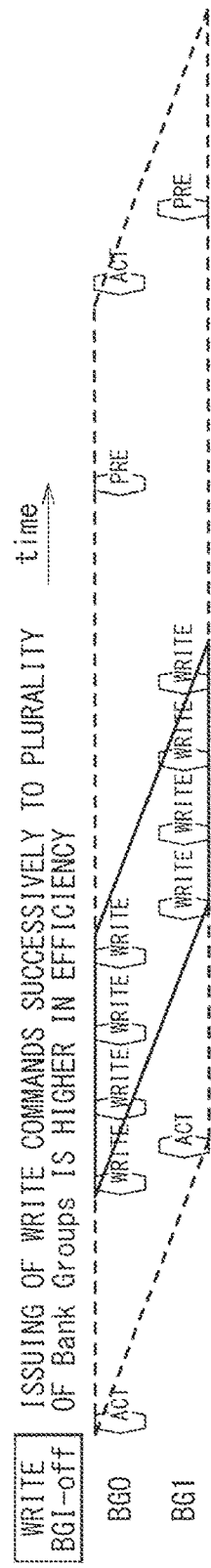

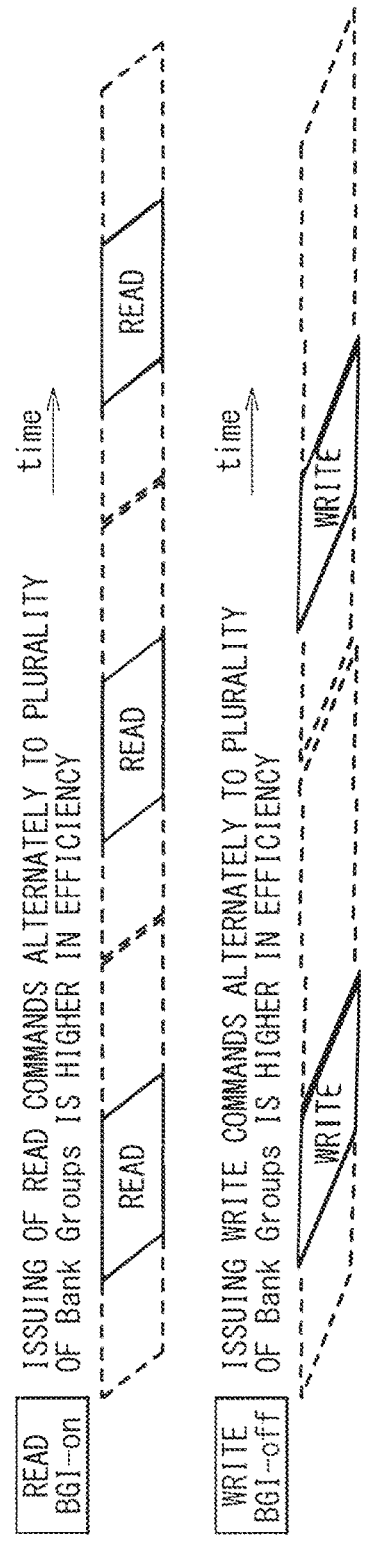

[FIG. 14]
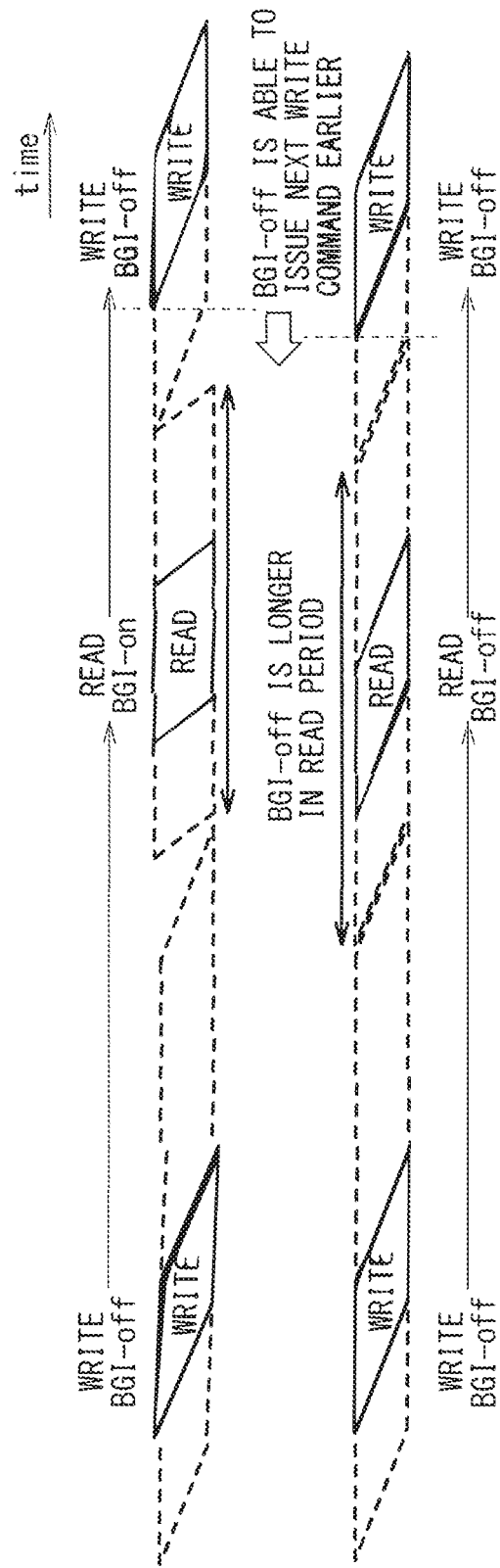

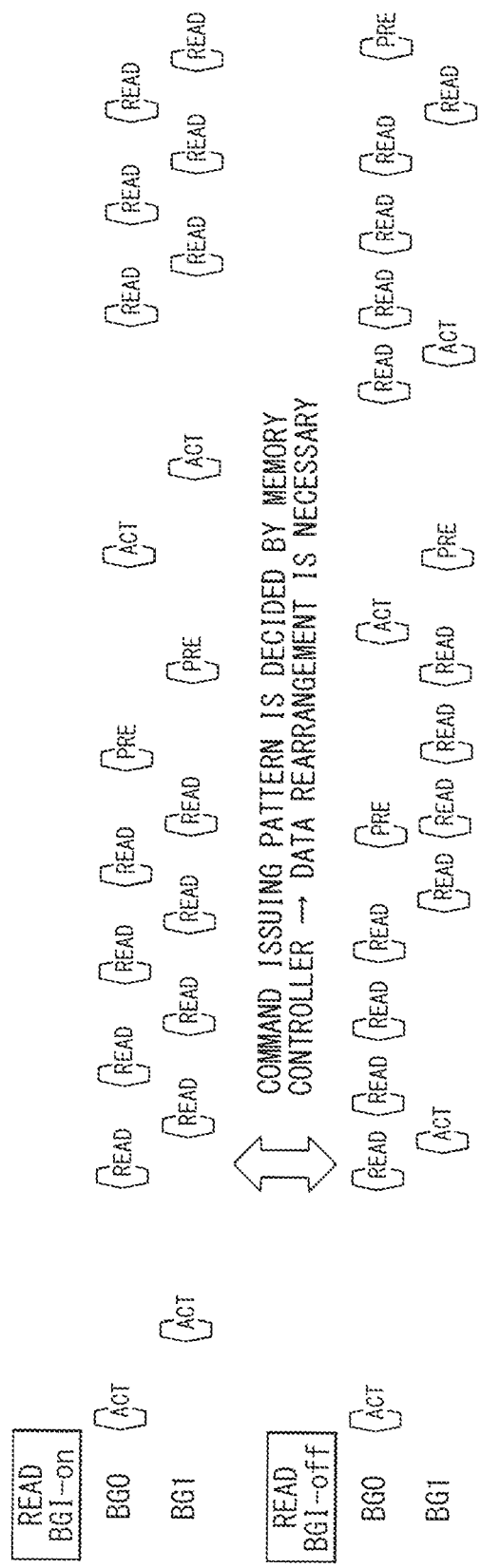

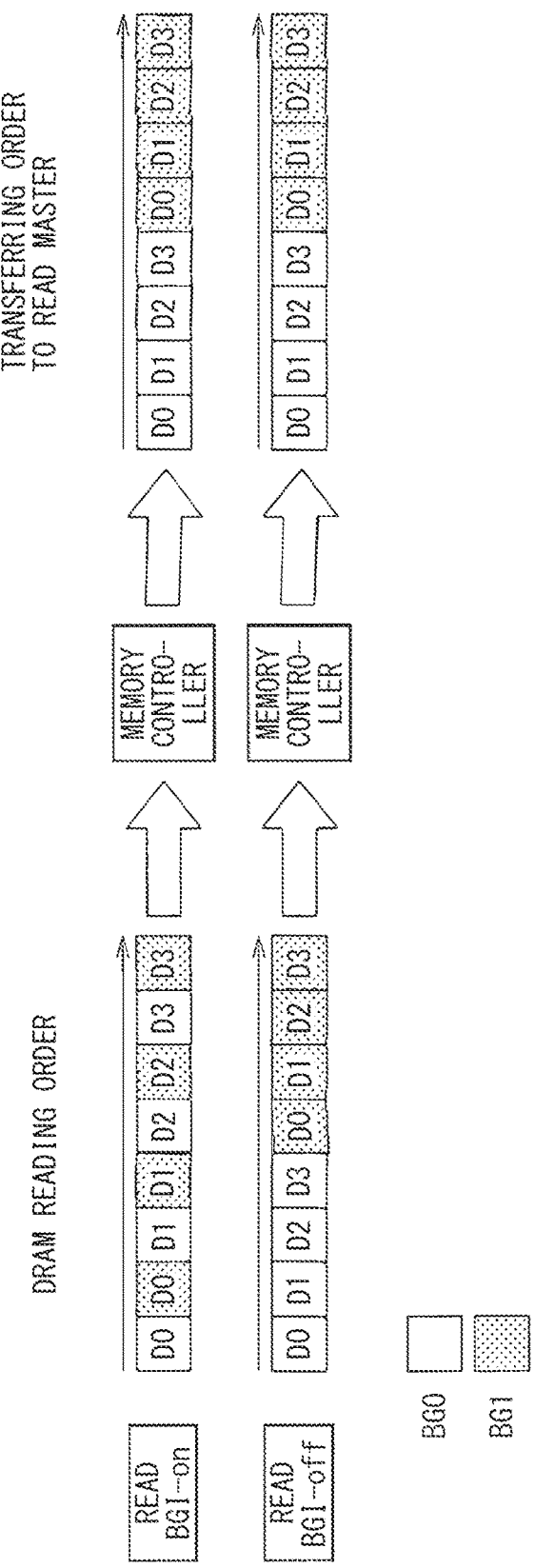

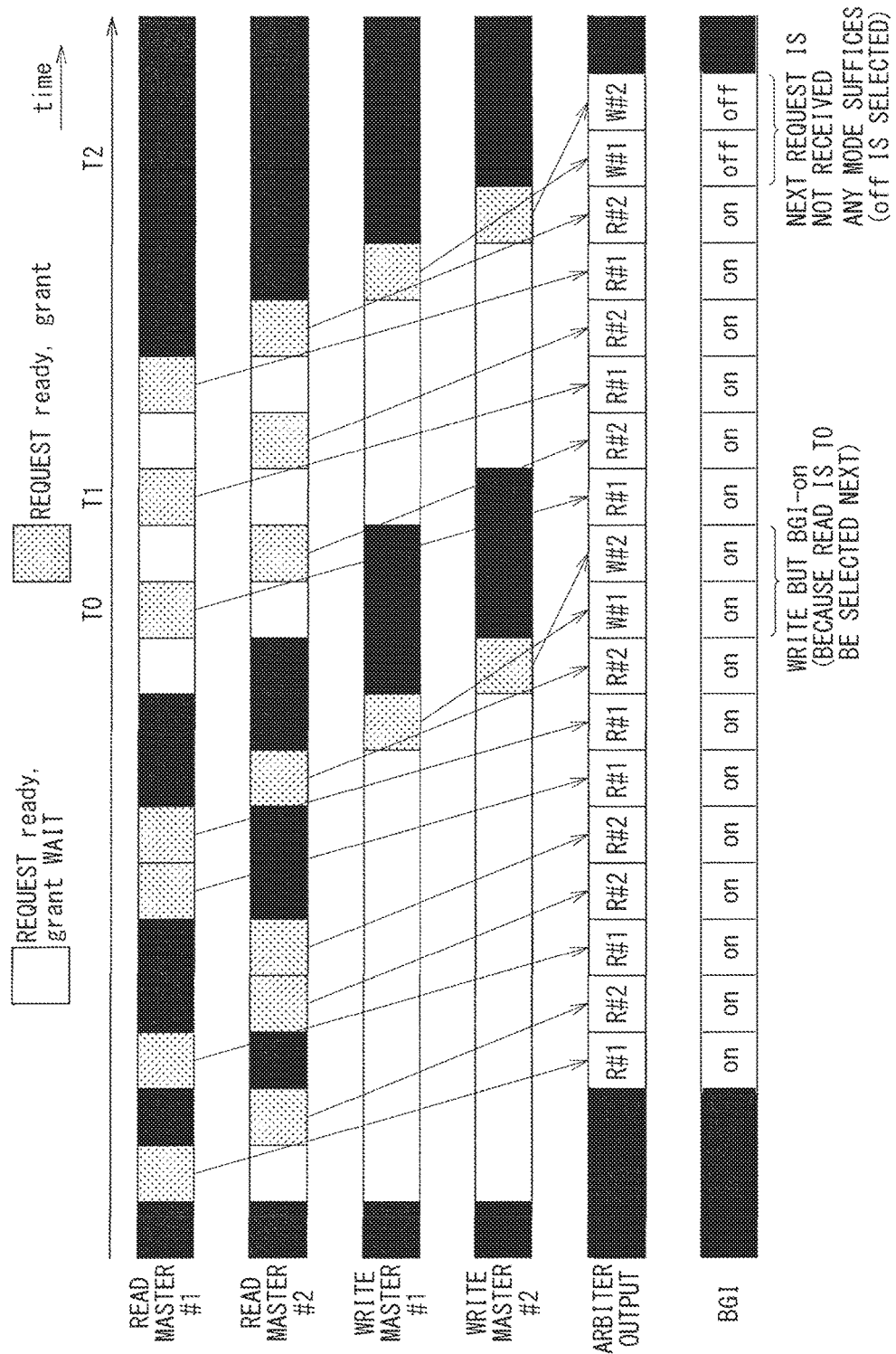

MEMORY CONTROL CIRCUIT AND MEMORY CONTROL METHOD

CROSS REFERENCE TO RELATED APPLICATIONS

This application is a U.S. National Phase of International Patent Application No. PCT/JP2016/062997 filed on Apr. 26, 2016, which claims priority benefit of Japanese Patent Application No. JP 2015-102625 filed in the Japan Patent Office on May 20, 2015. Each of the above-referenced applications is hereby incorporated herein by reference in its entirety.

TECHNICAL FIELD

The disclosure relates to a memory control circuit and a memory control method that are to be applied to a memory having a bank group function.

BACKGROUND ART

Along with acceleration of speed of a DRAM (Dynamic Random Access Memory), DDR (Double Data Rate) standard and DDR2 standard are released and the number of banks is increased to two, four, and eight. This makes it possible to hide overhead of open and close of a page that is a drawback of DRAM memory cell and to successively perform WRITE/READ. The method is called bank interleaving and is well known. In addition, as a technique to improve data transfer efficiency in the DRAM memory, each of PTLs 1 to 3 proposes a technique to perform rearrangement of memory addresses and data.

CITATION LIST

Patent Literature

PTL 1: U.S. Patent Application Publication No. 2015/0046642 specification
PTL 2: Japanese Unexamined Patent Application Publication No. 2004-164641
PTL 3: Japanese Unexamined Patent Application Publication No. 2010-277216

SUMMARY OF INVENTION

Further, in the resent DDR4 standard, a bank group is employed in which banks are divided into two to four groups, which doubles a data transfer band of IO (Input/Output) without increasing the number of pieces of data read in parallel from the memory cell array (without increasing the number of pieces of prefetch data), as compared with the old standard DDR3. Performing the bank group interleaving, however, does not increases the data transfer band at all times, and may reduce the data transfer band. Therefore, it is necessary to appropriately determine whether to perform the bank group interleaving. Determination as to whether to perform the bank group interleaving on the basis of the access pattern of WRITE/READ to a memory and a memory specification, especially on specification of a command interval, may possibly achieve higher data transfer band. Each of PTLs 1 to 3 described above fails to propose a technique to improve the data transfer efficiency in consideration of the bank groups.

It is desirable to provide a memory control circuit and a memory control method that make it possible to improve data transfer efficiency.

A memory control circuit according to an embodiment of the disclosure includes a memory control section that selectively uses a first issuing mode in which a plurality of control commands are issued without performing bank group interleaving and a second issuing mode in which the bank group interleaving is performed and the plurality of control commands are issued, and thereby issues the control commands to a plurality of bank groups in a memory having a bank group function.

A memory control method according to an embodiment of the disclosure includes issuing, by selectively using a first issuing mode in which a plurality of control commands are issued without performing bank group interleaving and a second issuing mode in which the bank group interleaving is performed and the plurality of control commands are issued, the control commands to a plurality of bank groups in a memory having a bank group function.

In the memory control circuit and the memory control method according to the respective embodiments of the disclosure, when issuing the control commands to the plurality of bank groups in the memory having the bank group function, the first issuing mode in which the plurality of control commands are issued without performing the bank group interleaving and the second issuing mode in which the bank group interleaving is performed and the plurality of control commands are issued are selectively used.

The memory control circuit and the memory control method according to the respective embodiments of the disclosure appropriately selects whether to perform the bank group interleaving when issuing the control commands to the plurality of bank groups. Hence, it is possible to improve data transfer efficiency.

Note that effects described here are not necessarily limiting. An effect may be any of effects described in the disclosure.

BRIEF DESCRIPTION OF DRAWINGS

FIG. 1 is a block diagram illustrating a configuration example of a memory bus system that includes a memory control circuit according to an embodiment of the disclosure.

FIG. 2 is a timing chart illustrating a first example of issue timing of control commands in a case where bank group interleaving is performed and only READ is performed.

FIG. 3 is a timing chart illustrating a second example of the issue timing of the control commands in the case where the bank group interleaving is performed and only READ is performed.

FIG. 4 is a timing chart illustrating an example of issue timing of control commands in a case where the bank group interleaving is not performed and only READ is performed.

FIG. 5 is a timing chart illustrating an example of issue timing of control commands in a case where the bank group interleaving is performed and only WRITE is performed.

FIG. 6 is a timing chart illustrating an example of issue timing of control commands in a case where the bank group interleaving is not performed and only WRITE is performed.

FIG. 7 is a timing chart illustrating a first example of switching from WRITE to READ.

FIG. 8 is a timing chart illustrating a second example of the switching from WRITE to READ.

FIG. 9 is a timing chart illustrating a third example of the switching from WRITE to READ.

FIG. 10 is a timing chart illustrating a fourth example of the switching from WRITE to READ.

FIG. 11 is a timing chart illustrating an example of issue timing of control commands in the case where the bank group interleaving is performed and only READ is performed.

FIG. 12 is a timing chart illustrating an example of issue timing of control commands in the case where the bank group interleaving is not performed and only WRITE is performed.

FIG. 13 is a diagram illustrating the timing charts of FIG. 11 and FIG. 12 in a simplified manner.

FIG. 14 is a timing chart illustrating comparison between a case where the bank group interleaving is performed and a case where the bank group interleaving is not performed when READ is performed between WRITE and WRITE.

FIG. 15 is a timing chart illustrating comparison of a command issuing pattern between the case where the bank group interleaving is performed and the case where the bank group interleaving is not performed when READ is performed.

FIG. 16 is an explanatory diagram illustrating an example of data arrangement of READ in the case where the bank group interleaving is performed and in the case where the bank group interleaving is not performed.

FIG. 17 is an explanatory diagram illustrating an operation example in a case where a mode of the bank group interleaving is switched by an arbiter.

DESCRIPTION OF EMBODIMENTS

An embodiment of the disclosure are described in detail below with reference to drawings. Note that description is given in the following order.
1. Memory bus system including memory control circuit
1.1 Configuration (FIG. 1)
1.2 Operation
1.2.1 Control operation in case of only READ (FIG. 2 to FIG. 4)
1.2.2 Control operation in case of only WRITE (FIG. 5 to FIG. 6)
1.2.3 Control operation in case of including WRITE and READ (FIG. 7 to FIG. 17)
1.3 Effects
2. Other embodiments 1. Memory Bus System Including Memory Control Circuit 1.1 Configuration FIG. 1 illustrates a configuration example of a memory bus system that includes a memory control circuit according to an embodiment of the disclosure.

A memory bus system 1 includes one or more bus masters, a memory control section 30, and a DDR-PHY (physical interface) 40. The bus masters include, for example, a plurality of READ masters 11 and 12 and a plurality of WRITE masters 21 and 22. The memory control section 30 includes an arbiter 31 and a memory controller 32. The memory control section 30 further includes an unillustrated buffer.

A memory 50 is a memory having a bank group function, for example, a memory of DDR4 standard or GDDR5 (Graphics Double Data Rate 5) standard. In FIG. 1, an example in which the memory 50 includes two DRAMs 51 and 52 respectively corresponding to two bank groups BG0 and BG1 is illustrated; however, the number of bank groups and the number of DRAMs are not limited to the example. Each of the DRAMs 51 and 52 includes a plurality of banks Bank0, Bank1, Bank2, and Bank3.

The READ masters 11 and 12 each perform READ (reading) request to the memory 50. Each of the READ masters 11 and 12 supplies a reading address to the memory 50 through the memory control section 30 and the DDR-PHY 40. Further, the READ masters 11 and 12 each receive, through the DDR-PHY 40 and the memory control section 30, read data read out from the memory 50. Note that an example in which two READ masters are included is illustrated in FIG. 1; however, the number of READ masters is not limited to the example.

The WRITE masters 21 and 22 each perform WRITE (writing) request to the memory 50. Each of the WRITE masters 21 and 22 supplies a writing (WRITE) address to the memory 50 through the memory control section 30 and the DDR-PHY 40. Further, each of the WRITE masters 21 and 22 supplies, to the memory control section 30, writing data to the memory 50 through the memory control section 30 and the DDR-PHY 40. Note that an example in which two WRITE masters are included is illustrated in FIG. 1; however, the number of WRITE masters is not limited to the example.

The memory control section 30 generates control commands in response to the requests made from the READ masters 11 and 12 and the WRITE masters 21 and 22, and supplies the control commands to the memory 50 through the DDR-PHY 40. Note that examples of the control command include a READ command, a WRITE command, an ACT command, and a PRE command.

The arbiter 31 arbitrates the requests made from the READ masters 11 and 12 and the WRITE masters 21 and 22, and determines order of the requests. Input and output of the request with respect to the arbiter 31 is typically specified by a protocol that makes an access to the memory 50, for example, AHB (Advanced High-performance Bus), AXI (Advanced eXtensible Interface), or OCP (Open Core Protocol).

The memory controller 32 controls operation of the memory 50 on the basis of an instruction from the arbiter 31. The memory controller 32 converts output from the arbiter 31 into a DRAM access protocol, thereby generating control commands.

The DDR-PHY 40 is an interface of a physical layer that couples the memory controller 32 and each of the DRAMs 51 and 52 of the memory 50. The DDR-PHY 40 may be coupled to each of the DRAMs 51 and 52 through an unillustrated I/O terminal.

1.2 Operation

In the memory bus system 1, the memory control section 30 selectively uses a first issuing mode and a second issuing mode to issue control commands to the plurality of bank groups BG0 and BG1 of the memory 50. In the first issuing mode, a plurality of control commands are issued without performing the bank group interleaving. In the second issuing mode, the bank group interleaving is performed and a plurality of control commands are issued.

The memory control section 30 issues, as the control commands, one or both of WRITE command and READ command a plurality of times to the plurality of bank groups.

A minimum number of cycles of a command interval in the memory 50 is different between a case where the plurality of control commands are successively issued to the same bank group (in the case where the plurality of commands are issued without performing the bank group interleaving) and a case where the plurality of control commands are alternately issued to two or more different bank groups (in the case where the bank group interleaving is performed and the plurality of control commands are issued).

When issuing the control commands, the memory control section 30 selects the first issuing mode in a case where it is determined, on the basis of a command interval of the control commands defined by the specification, that issuing of the plurality of control commands successively to the same bank group is higher in data transfer efficiency. In contrast, in a case where it is determined that issuing of the plurality of control commands alternately to the two or more different bank groups is higher in data transfer efficiency, the memory control section 30 selects the second issuing mode.

Specific examples of the control operation on the memory 50 performed by the memory bus system 1 according to the present embodiment are described below with reference to FIG. 2 to FIG. 17.

In the following, the bank group interleaving (Bank Group Interleave) is abbreviated as BGI in some cases. Further, in the following, the first issuing mode in which a plurality of control commands are issued without performing the bank group interleaving is referred to as BGI-off in some cases. Furthermore, the second issuing mode in which the bank group interleaving is performed and a plurality of control commands are issued is referred to as BGI-on in some cases. Moreover, in the present embodiment, two modes of the BGI-off and the BGI-on are collectively referred to as a BGI mode, an issuing mode, or a mode of bank group interleaving.

The mode of the bank group interleaving is determined as follows, for example.

Condition 1: A request inputted to the buffer which is the earliest

Condition 2: A bank group different from a bank group of a command issued immediately therebefore For example, among the control commands buffered in the memory control section 30 at a certain time point, the issuing mode that preferentially selects the above-described condition 1 is defined as the BGI-off, and the issuing mode that preferentially selects the condition 2 and the condition 1 in this order is defined as the BGI-on.

Note that meanings of terms used in FIG. 2 and other drawings are as follows.

RAS . . . Row Address Strobe, namely, an ACT command. The DRAMs 51 and 52 receive a Row address.
CAS . . . Column Address Strobe, namely, a WRITE command or a READ command. The DRAMs 51 and 52 receive a column address.
BL . . . Burst Length
CL . . . CAS Latency, namely, a time from enabling of a READ command to output start of READ data. Also referred to as RL.
CWL . . . CAS Write Latency, namely, a time from enabling of a WRITE command to input start of WRITE data. Also referred to as WL.
BC . . . Burst Chop
tRCD . . . RAS# to CAS# Delay
tRP . . . RAS# Precharge time
tCCD . . . CAS# to CAS# Delay
tWR . . . Write Recovery time
tWTR . . . Write to Read delay
tRRD . . . RAS# to RAS# Delay
tFAW . . . Four Activate Window delay
_S . . . Short
_L . . . Long Here, a case where each of the DRAMs 51 and 52 of the memory 50 is compliant with the DDR4-2400 standard is described as an example. When it is assumed that BL is equal to 8 and I/O is 16 bits, the data of 8×16=128 bits is written to each of the DRAMs 51 and 52 per WRITE command. In addition, an access pattern is assumed of accessing eight banks of the DRAMs 51 and 52 in order, on the basis of two commands for the same bank of the DRAMs 51 and 52. In this case, access is made by unit of 128 bit×2×8=4096 bits. This access pattern allows the data transfer efficiency to be maintained constant even when a Row address opened for each 4096 bits is freely selected. Therefore, the access pattern can be considered as a minimum unit of random access. In the following, the pattern is referred to as a "basic access pattern".

When the restriction of the command interval of the DDR4-2400 is read from the written standards of DDR4, CL is equal to 16, tRCD is equal to 16, tRP is equal to 16, tFAW is equal to 36, tRRD_S is equal to 7, tRRD_L is equal to 8, tCCD_S is equal to 4, tCCD_L is equal to 6, tWTR_S is equal to 3, tWTR_L is equal to 9, tWR is equal to 18, CWL is equal to 16, and tRTP is equal to 9. The unit thereof is clock number unless otherwise noted.

1.2.1 Control Operation in Case of Only READ

First, specific examples of control operation in a case of performing only READ are described with reference to FIG. 2 to FIG. 4.

FIG. 2 illustrates a first example of issue timing of control commands in a case where the bank group interleaving is performed and only READ is performed. FIG. 3 illustrates a second example of the issue timing of the control commands in the case where the bank group interleaving is performed and only READ is performed. FIG. 4 illustrates an example of issue timing of control commands in a case where the bank group interleaving is not performed and only READ is performed.

In the case of the BGI-on, it is possible to issue the READ command 16 times in 72 clocks in the basic access pattern. This is because it is possible to issue the ACT command four times during tFAW=36 and the READ command is issued twice for each bank, and the READ command is accordingly issued eight times in total. Therefore, it is possible to achieve data transfer efficiency of $32/36=88.9\%$ at a maximum.

As illustrated in FIG. 4, in the case of the BGI-off, it is possible to issue the READ command twice during tCCD_L+tCCD_S=10 clocks, which makes it possible to achieve the data transfer efficiency of $8/10=80\%$ at a maximum. Hence, selecting the BGI-on makes it possible to achieve higher data transfer efficiency when READ is performed.

Note that the example in FIG. 2 is an example in which the pattern of the Bank0 is shifted by eight clocks to form the pattern of the Bank1. In the example of FIG. 2, however, the ACT command and the READ command collide with each other. Therefore, the example in FIG. 3 illustrates an example in which the requests of the Bank1 and Bank3 are shifted by one clock from each other to avoid the collision. Note that it is possible to hide the PRE command by the READ/WRITE command with Auto Precharge. Therefore, shift of the PRE command for collision avoidance may not be performed.

1.2.2 Control Operation in Case of Only WRITE

Next, specific examples of control operation in a case of performing only WRITE are described with reference to FIG. 5 and FIG. 6.

FIG. 5 illustrates an example of issue timing of control commands in a case where the bank group interleaving is performed and only WRITE is performed. FIG. 6 illustrates an example of issue timing of control commands in a case where the bank group interleaving is not performed and only WRITE is performed.

In the case of the BGI-on, it is possible to issue the WRITE command 16 times in 81 clocks in the basic access pattern. Therefore, it is possible to achieve data transfer efficiency of $^{64}/_{81}=79.0\%$ at a maximum. In the case of the BGI-off, it is possible to issue the WRITE command twice during tCCD_L+tCCD_S=10 clocks. Therefore, it is possible to achieve data transfer efficiency of $^{8}/_{10}=80\%$ at a maximum. Hence, selecting the BGI-off makes it possible to achieve higher data transfer efficiency when WRITE is performed.

1.2.3 Control Operation in Case Including WRITE and READ

The memory control section 30 counts the number of WRITE commands and the number of READ commands until switching from the WRITE command to the READ command and until switching from the READ command to the WRITE command. In a case where the number of issues of the READ command sandwiched between the WRITE commands is equal to or larger than a predetermined value, the memory control section 30 selects the second issuing mode and issues the READ command. Further, in a case where the number of issues of the READ command is smaller than the predetermined value, the memory control section 30 selects the issuing mode that is the same as the mode of the WRITE command immediately before the READ command is issued, and issues the READ command.

Further, the memory control section 30 counts the number of WRITE commands and the number of READ commands until switching from the READ command to the WRITE command and until switching from the WRITE command to the READ command. In a case where the number of issues of successive WRITE commands sandwiched between the READ commands is equal to or larger than a predetermined value, the memory control section 30 selects the first issuing mode and issues the WRITE command. Further, in a case where the number of issues of successive WRITE commands is smaller than the predetermined value, the memory control section 30 selects the issuing mode that is the same as the mode of the READ command immediately before the WRITE command is issued, and issues the WRITE command.

Specific examples of control operation in a case where both of WRITE and READ are performed are described with reference to FIG. 7 to FIG. 17.

FIG. 7 illustrates a first example of switching timing from WRITE to READ. The first example in which WRITE is performed in the BGI-on and READ is then performed in the BGI-on is illustrated on an upper part in FIG. 7. The first example in which WRITE is performed in the BGI-off and READ is then performed in the BGI-on is illustrated on a lower part in FIG. 7. Note that, in FIG. 7, an example is illustrated in which an ACT command and a PRE command are not issued at switching from WRITE to READ.

FIG. 8 illustrates a second example of switching timing from WRITE to READ. The second example in which WRITE is performed in the BGI-on and READ is then performed in the BGI-on is illustrated on an upper part in FIG. 8. The second example in which WRITE is performed in the BGI-on and READ is then performed in the BGI-off is illustrated on a lower part in FIG. 8.

FIG. 9 illustrates a third example of switching timing from WRITE to READ. FIG. 9 illustrates an example in which WRITE is performed in the BGI-off and READ is then performed in the BGI-on. FIG. 10 illustrates a fourth example of switching timing from WRITE to READ. FIG. 10 illustrates an example in which WRITE is performed in the BGI-on and READ is then performed in the BGI-on.

The DRAMs 51 and 52 transfer data through bidirectional I/O in a half-duplex manner. Therefore, to achieve data transfer efficiency in the above-described case where only READ or only WRITE is performed, performing READ or WRITE as successively as possible is the premise. This is because a drive direction of a data pin is switched at the switching from READ to WRITE or from WRITE to READ, and invalid time (during which the data transfer is not performable) accordingly occurs. Depending on a system request to the memory bus, however, performing short WRITE during the successive READ may become necessary in some cases, for example, in a case where the number of WRITE requests is significantly smaller than the number of READ requests but it is not possible to keep the WRITE request waiting. In contrast, performing short READ during the successive WRITE may become necessary in some cases. In these cases, when the BGI mode is switched to the BGI-on for short READ after relatively long WRITE is performed continuously in the BGI-off, the data transfer efficiency may sometimes be deteriorated. In addition, the data transfer efficiency may sometimes be deteriorated also in, for example, a case where the BGI mode is switched to the BGI-off for short WRITE after relatively long READ is performed continuously in the BGI-on.

At the switching from WRITE to READ, an interval from last WRITE command to next READ command is specified by DRAM standard. Therefore, it is necessary to delay issue of a READ command by an amount corresponding to the delay of the last WRITE command at the switching from WRITE to READ. In comparison of a time from WRITE start to WRITE end, issue of a WRITE command is finished earlier in the BGI-on than in the BGI-off. Therefore, in the case where short WRITE is performed during the successive READ in the BGI-on, selecting the BGI-on makes it possible to achieve higher data transfer efficiency also when the short WRITE is performed. In addition, in the case where short READ is performed during the successive WRITE in the BGI-off, selecting the BGI-off makes it possible to achieve higher data transfer efficiency also when the short READ is performed.

Here, data transfer efficiency in the case where the short READ is performed during the successive WRITE in the BGI-off is described with reference to FIG. 11 to FIG. 14.

FIG. 11 illustrates an example of issue timing of control commands in the case where the bank group interleaving is performed and only READ is performed. FIG. 12 illustrates an example of issue timing of control commands in the case where the bank group interleaving is not performed and only WRITE is performed. FIG. 13 illustrates the timing charts of FIG. 11 and FIG. 12 in a simplified manner. As described above, in the case where only READ is performed, the data transfer efficiency becomes high when the BGI-on is selected and the READ command is issued alternately to the plurality of bank groups. Further, in the case where only WRITE is performed, the data transfer efficiency becomes high when the BGI-off is selected and the WRITE command is issued alternately to the plurality of bank groups.

FIG. 14 illustrates a comparison between a case where READ is performed in the BGI-on (an upper part in FIG. 14) and a case where READ is performed in the BGI-off (a lower part in FIG. 14) when READ is performed between WRITE in the BGI-off and WRITE in the BGI-off. When the BGI-on is selected, a period of only READ is short. In consideration of the time necessary for switching to WRITE, however, the switching timing from READ to WRITE becomes earlier, which allows WRITE command after READ to be issued earlier as a result, when the BGI-off is selected.

Note that, in the case where the BGI mode is switched for performing READ or WRITE, it may be necessary to adjust the reading order or the writing order of data between the DRAMs 51 and 52 and the memory controller 32 and the data transfer order between the memory controller 32 and the bus masters.

FIG. 15 illustrates a comparison of a command issuing pattern between the case where the bank group interleaving is performed and the case where the bank group interleaving is not performed, when READ is performed. FIG. 16 illustrates examples of the reading order of data between the memory controller 32 and the DRAMs 51 and 52, and the data transfer order between the memory controller 32 and the READ masters 11 and 12, corresponding to the command issuing pattern of FIG. 15. In each of FIG. 15 and FIG. 16, an upper part indicates the case of the BGI-on, and a lower part indicates the case of the BGI-off. For example, as illustrated in the upper part in each of FIG. 15 and FIG. 16, in the case of the BGI-on, data is alternately read out from the DRAMs 51 and 52 (the bank groups BG0 and BG1). The memory controller 32 adjusts data array such that each data from the bank groups BG0 and BG1 becomes continuous, and transfers the adjusted data to the READ masters 11 and 12.

In the case where the switching of the BGI mode described above is performed, the arbiter 31 or the memory controller 32 decides whether to select the BGI-off or the BGI-on.

FIG. 17 illustrates an operation example in the case where the arbiter 31 performs switching of the BGI mode. In FIG. 17, request timing of the READ master 11 (READ master #1), request timing of the READ master 12 (READ master #2), request timing of the WRITE master 21 (WRITE master #1), and request timing of the WRITE master 22 (WRITE master #2) are illustrated in order from an upper part. In FIG. 17, request timing outputted from the arbiter 31 on the basis of the requests from the READ masters 11 and 12 and the WRITE masters 21 and 22 is further illustrated. The request of READ is denoted as R#, and the request of WRITE is denoted as W#. A kind of the BGI mode selected by the arbiter 31 is illustrated by on or off in the lowermost part in FIG. 17.

In the memory bus system 1, the access arbitration order of the plurality of bus masters is not normally changed after being decided by the arbiter 31. In other words, a function that "READ or WRITE is performed as successively as possible" or other function is normally achieved by the arbiter 31. The arbiter 31 includes a timer that counts a time with use of a time of switching to READ or WRITE as a trigger. Alternatively, the arbiter 31 includes a counter that counts the number of requests.

In a case where the number of READ requests and the number of WRITE requests are large (in a case where the number of issues of the command is equal to or larger than a predetermined value), the arbiter 31 selects the BGI mode that is the highest in data transfer efficiency. For example, in the example of DDR4-2400, the arbiter 31 selects the BGI-on for READ and selects the BGI-off for WRITE.

In a case where the number of READ requests is large but the number of WRITE requests is small (in a case where the number of issues of the WRITE command is smaller than the predetermined value), the arbiter 31 selects the BGI mode that is high in data transfer efficiency for READ. For example, in the case of DDR4-2400, the arbiter 31 selects the BGI-on.

In a case where the number of WRITE requests is large but the number of READ requests is small (in a case where the number of issues of the READ command is smaller than the predetermined value), the arbiter 31 selects the BGI mode that is high in data transfer efficiency for WRITE. For example, in the case of DDR4-2400, the arbiter 31 selects the BGI-off.

In a case where the number of READ requests and the number of WRITE requests are both small (in a case where the number of issues of the command is smaller than the predetermined value), any of the BGI modes may be selected because the number of pieces of valid data is small and the efficiency does not become high accordingly.

When determining whether to switch on/off of the BGI mode on the basis of the number of successive READ requests or the number of successive WRITE requests, there is a break-even point (a predetermined value). Prediction of the number of successive READ request or the number of successive WRITE requests in the future, however, is difficult. FIG. 17 illustrates an example in which a certain number of requests are buffered to postpone the decision of the BGI mode until the BGI mode is decided.

When the arbiter 31 outputs the request of the WRITE master #1 at time T0 in FIG. 17, the arbiter 31 selects the BGI-on for the WRITE request because the request of the READ master #1 has been granted (allowed). When the arbiter 31 outputs the request of the READ master #1 at time T1, the arbiter 31 selects the BGI-on for the READ request because the request of the READ master #1 has been granted. When the arbiter 31 outputs the request of the WRITE master #1 at time T2, the arbiter 31 selects the BGI-off for the WRITE request because any request has not been granted.

1.3 Effects

As described above, according to the present embodiment, when the control commands are issued to the plurality of bank groups, whether to perform the bank group interleaving is appropriately selected to allow the issuing schedule of the control commands to be optimized. Hence, it is possible to improve data transfer efficiency.

Note that the effects described in the present specification are illustrative and non-limiting. There may be other effects as well.

2. Other Embodiments

The technique of the disclosure is not limited to the description of the above-described embodiment, and may be variously modified.

(1)
A memory control circuit including
a memory control section that selectively uses a first issuing mode in which a plurality of control commands are issued without performing bank group interleaving and a second issuing mode in which the bank group interleaving is performed and the plurality of control commands are issued, and thereby issues the control commands to a plurality of bank groups in a memory having a bank group function.

(2)
The memory control circuit according to (1), in which the memory is different in minimum number of cycles of a command interval between a case where the plurality of control commands are issued successively to the same bank group and a case where the plurality of control commands are issued alternately to the two or more different bank groups.

(3)
The memory control circuit according to (1) or (2), in which the memory control section issues, as the control commands, one or both of a WRITE command and a READ command a plurality of times to the plurality of bank groups.

(4)
The memory control circuit according to any one of (1) to (3), in which, when issuing the control commands, and on a basis of a command interval of the control commands defined by specification, the memory control section
selects the first issuing mode in a case where it is determined that issuing of the plurality of control commands successively to the same bank group is higher in data transfer efficiency, and
selects the second issuing mode in a case where it is determined that issuing of the plurality of control commands alternately to the two or more different bank groups is higher in the data transfer efficiency.

(5)
The memory control circuit according to any one of (1) to (4), in which the memory control section
counts the number of the WRITE commands and the number of the READ commands until switching from the WRITE command to the READ command and until switching from the READ command to the WRITE command,
selects the second issuing mode and issues the READ command, in a case where the number of issues of the READ command sandwiched between the WRITE commands is equal to or larger than a predetermined value, and
selects the issuing mode that is same as the issuing mode of the WRITE command immediately before the READ command is issued and issues the READ command, in a case where the number of issues of the READ command is smaller than the predetermined value.

(6)
The memory control circuit according to any one of (1) to (5), in which the memory control section
counts the number of the WRITE commands and the number of the READ commands until switching from the READ command to the WRITE command and until switching from the WRITE command to the READ command,
selects the first issuing mode and issues the WRITE command, in a case where the number of issues of the successive WRITE commands sandwiched between the READ commands is equal to or larger than a predetermined value, and
selects the issuing mode that is same as the issuing mode of the READ command immediately before the WRITE command is issued and issues the WRITE command, in a case where the number of issues of the successive WRITE commands is smaller than the predetermined value.

(7)
A memory control method including
issuing, by selectively using a first issuing mode in which a plurality of control commands are issued without performing bank group interleaving and a second issuing mode in which the bank group interleaving is performed and the plurality of control commands are issued, the control commands to a plurality of bank groups in a memory having a bank group function.

This application is based upon and claims the benefit of priority of the Japanese Patent Application No. 2015-102625 filed with the Japan Patent Office on May 20, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A memory control circuit, comprising:
a memory control section configured to:
selectively use a first issuing mode and a second issuing mode based on a command interval of a plurality of control commands, wherein
the command interval is defined by a specification,
in the first issuing mode the plurality of control commands are issued without performing bank group interleaving, and
in the second issuing mode the bank group interleaving is performed and the plurality of control commands are issued; and
issue the plurality of control commands to a plurality of bank groups in a memory having a bank group function, wherein the memory is compliant to the specification.

2. The memory control circuit according to claim 1, wherein a minimum number of cycles of the command interval in the memory is different between a first case where the plurality of control commands are issued successively to a same bank group of the plurality of bank groups and a second case where the plurality of control commands are issued alternately to two or more different bank groups of the plurality of bank groups.

3. The memory control circuit according to claim 1, wherein the memory control section is further configured to issue, as the plurality of control commands, one or both of a WRITE command and a READ command a plurality of times to the plurality of bank groups.

4. The memory control circuit according to claim 1, wherein, based on issuance of the plurality of control commands and the command interval of the plurality of control commands defined by the specification, the memory control section is further configured to:
select the first issuing mode based on a determination that the issuance of the plurality of control commands successively to a same bank group is higher in data transfer efficiency; and
select the second issuing mode based on a determination that the issuance of the plurality of control commands alternately to two or more different bank groups is higher in the data transfer efficiency.

5. The memory control circuit according to claim 1, wherein the memory control section is further configured to:

count a number of WRITE commands and a number of READ commands until switch from a WRITE command to a READ command and until switch from the READ command to the WRITE command;

select the second issuing mode and issue the READ command, based on a number of issues of the READ command sandwiched between the WRITE commands that is equal to or larger than a determined value; and select an issuing mode that is same as an issuing mode of the WRITE command immediately before the READ command is issued and issue the READ command, based on the number of issues of the READ command that is smaller than the determined value.

6. The memory control circuit according to claim 1, wherein the memory control section is further configured to:

count a number of WRITE commands and a number of READ commands until switch from a READ command to a WRITE command and until switch from the WRITE command to the READ command;

select the first issuing mode and issue the WRITE command, based on a number of issues of successive WRITE commands sandwiched between the READ commands that is equal to or larger than a determined value; and select an issuing mode that is same as an issuing mode of the READ command immediately before the WRITE command is issued and issue the WRITE command, based on the number of issues of the successive WRITE commands that is smaller than the determined value.

7. A memory control method, comprising:

selectively using a first issuing mode and a second issuing mode based on a command interval of a plurality of control commands, wherein the command interval is defined by a specification, in the first issuing mode the plurality of control commands are issued without performing bank group interleaving, and in the second issuing mode the bank group interleaving is performed and the plurality of control commands are issued; and issuing the plurality of control commands to a plurality of bank groups in a memory having a bank group function, wherein the memory is compliant to the specification.

* * * * *